(12) United States Patent
Shin

(10) Patent No.: US 7,280,427 B2
(45) Date of Patent: Oct. 9, 2007

(54) DATA ACCESS CIRCUIT OF SEMICONDUCTOR MEMORY DEVICE

(75) Inventor: Dong-Hak Shin, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 369 days.

(21) Appl. No.: 11/015,462

(22) Filed: Dec. 16, 2004

(65) Prior Publication Data

US 2005/0141279 A1  Jun. 30, 2005

(30) Foreign Application Priority Data

Dec. 30, 2003  (KR)  ............... 10-2003-0099577

(51) Int. Cl.
*G11C 8/00* (2006.01)
(52) U.S. Cl. ............... 365/230.05; 365/230.08; 365/230.06; 365/189.04; 365/189.05
(58) Field of Classification Search .......... 365/230.05, 365/189.04, 230.06
See application file for complete search history.

(56) References Cited

U.S. PATENT DOCUMENTS

| | | | |
|---|---|---|---|
| 5,007,028 A | 4/1991 | Ohshima et al. | |
| 5,375,089 A | 12/1994 | Lo | |
| 5,671,392 A | 9/1997 | Parris et al. | |
| 5,978,307 A | 11/1999 | Proebsting et al. | |
| 6,122,218 A * | 9/2000 | Kang | 365/230.05 |

* cited by examiner

*Primary Examiner*—Thong Q. Le
(74) *Attorney, Agent, or Firm*—Marger Johnson & McCollom, P.C.

(57) ABSTRACT

A data access circuit of a semiconductor memory device in which data is read and written via all multiple ports in the semiconductor memory device having a multi-port structure. The data access circuit device having a multi-port structure comprises a write controller, a plurality of ports to receive serial data to be written, a plurality of read/write data control units, a plurality of write buffer units, a read controller, an input/output sense amplifier, and a plurality of read buffer units. Test time for the semiconductor memory device can be shortened by doubling the number of ports even in low frequency equipment, thus improving the throughput, by allowing data to be simultaneously and divisionally accessed via all ports, instead of accessing the data via a specified port at a time.

23 Claims, 11 Drawing Sheets

DATA ACCESS CIRCUIT OF SEMICONDUCTOR MEMORY DEVICE

CROSS-REFERENCE TO RELATED APPLICATION

This application claims the benefit of Korean Patent Application No. 2003-0099577, filed on Dec. 30, 2003, the disclosure of which is hereby incorporated herein by reference in its entirety.

BACKGROUND

1. Technical Field

The disclosure relates to a data access circuit of a semiconductor memory device and, more particularly, to a data access circuit of a semiconductor memory device in which data is read and written via all multiple ports in a semiconductor memory device having a multi-port structure.

2. Discussion of the Related Art

Generally, a random access memory device is a type of digital memory device having memory cells for storing bit data and digital data therein. Any of the memory cells can be addressed and accessed independent of other memory cells.

A random access memory (RAM) includes a read only memory (ROM) and a read/write memory (RWM). Both ROM and RWM include various static load, synchronous, and asynchronous memory devices. Further, in the RAM, there are static memory architecture and dynamic memory architecture. The static memory architecture has some storage configurations with latches while the dynamic memory architecture has some storage configurations in which charges are dynamically stored in capacitors.

Dynamic RAMs (DRAMs) and synchronous dynamic RAMs (SDRAMs) are types of dynamic architectures being commercially and widely used in various types of digital devices. In particular, the SDRAMs are being extensively used because of its fast accessibility. Memory cells of a memory array in the SDRAM are normally divided into banks. Further, the SDRAMs include circuitry for allowing an operation of a 'burst mode.' In the burst mode, the memory cells are accessible at a much higher access speed than can be realized with memory cells of a conventional asynchronous DRAM.

The SDRAMs undergo a test in a manufacture process in order to confirm whether the memory cells operate properly. During the testing process, data of a known value is written to memory cells in the memory array bank, like other types of memory devices. Data is applied by various addressing sequences, typically to all memory cells in the memory array.

In the case of the SDRAMs, a time needed to write data to all memory cells in the banks of the memory array increases as the capacity of the SDRAM increases, like other memory devices. Such increasing amount of time reduces the throughput of the memory devices in the testing process.

The SDRAM is designed to comply with standards and communication protocols defined by the Joint Electronic Device Engineering Council (JEDEC). Present standards and communication protocols by the JEDEC include a defined signal protocol for a signal which causes the memory cells of the SDRAM to be addressed. For instance, an address select signal is defined. The address select signal, when applied to the SDRAM, enables the memory cells of the SDRAM to be addressed.

Upon testing the SDRAM, a series of address select signals are applied to the memory device, and the memory cells of the memory device are addressed in response to values of the address select signals. Data is written sequentially to the addressed memory cells.

Typically, a software algorithm is executed by a processor and the address select signals are generated onto address select lines. The memory cells are addressed in response to values of the address select signals, which are generated on all address select lines applied to the SDRAM except for a next bit to the most significant bit. Accordingly, upon testing the SDRAM, it is impossible to access all memory cells of the SDRAM only with the address select signals that are incremented by one bit, in which the address select signals are generated by a software algorithm used to generate the address select signals.

To solve this problem, a technique capable of simultaneously addressing columns for a plurality of memory banks, and at the same time, of simultaneously writing data to the memory cells in a SDRAM or a memory device having a plurality of memory banks, is disclosed in U.S. Pat. No. 5,671,392. In U.S. Pat. No. 5,671,392, the column of the memory banks can be addressed concurrently and the data can be read and/or written concurrently.

In addition, a multi-port access memory in which an address decoder and read/write data paths for read and write are shared, thus reducing the size of the memory, is disclosed in U.S. Pat. No. 6,122,218.

In such a semiconductor memory device having a multi-port structure, however, one port serves as a read/write port and all input/output lines share the same bits at all ports.

FIG. 1 is a diagram illustrating a write data line control circuit of a conventional semiconductor memory device having a multi-port structure.

The control circuit is composed of a write controller 10 enabled by a write control signal Write to receive a column cycle signal Colcyc and output an input/output driver enable signal; first to fourth ports 20, 22, 24, and 26 receive serial data, each converting the serial data to 512-bit parallel data, and then outputting the parallel data; a first write buffer unit 30 for buffering the 512-bit parallel data received from the first port 20 to output the buffered parallel data to data lines 40 in response to a first port select signal load_P0; a second write buffer unit 32 for buffering the 512-bit parallel data received from the second port 22 to output the buffered parallel data to the data lines 40 in response to a second port select signal load_P1; a third write buffer unit 34 for buffering the 512-bit parallel data received from the third port 24 to output the buffered parallel data to the data lines 40 in response to a third port select signal load_P2; a fourth write buffer unit 36 for buffering the 512-bit parallel data, received from the fourth port 26, to output the buffered parallel data to the data lines 40 in response to a fourth port select signal load_P3; an input/output driver 50 for receiving the 512-bit data, inputted from the data lines 40, to output the received data to input/output lines IO0 to IO511 in response to the input/output driver enable signal from the write controller 10.

FIG. 2 is a write timing diagram of a conventional semiconductor memory device.

The operation for controlling data lines upon writing data will be described with reference to FIGS. 1 and 2. In order to write the data to memory cells, when receiving an address Addre and a column latch signal Collat as shown in FIG. 2, a column decoder (not shown) generates a column select signal CSL and connects bit lines with the input/output lines IQ0 to IQ511. The write controller 10 is enabled by a write control signal Write as shown in FIG. 2 to receive a column cycle signal Colcyc, also shown FIG. 2, and output the input/output driver enable signal to the input/output driver 50. At this time, serial data to be written is applied to the first to fourth ports 20, 22, 24, and 26. The first to fourth ports 20, 22, 24, and 26 receive the serial data, convert the serial data to 512-bit parallel data PORT0 to PORT3 as shown in FIG. 2, and output the parallel data to the first to fourth write buffer units 30, 32, 34, and 36. At this time, first to fourth port select signals load_P0 to load_P3 are sequentially generated in one cycle unit of the column latch signal Collat as shown in FIG. 2. The first to fourth write buffer units 30, 32, 34, and 36 sequentially output 512-bit write data WD as shown FIG. 2 to the data lines 40 in response to the first to fourth port select signals load_P0 to load_P3. At this time, the 512-bit data inputted from one port is mapped with one column address. The 512-bit data, outputted to the data lines 40, is applied to the input/output driver 50. The input/output driver 50 outputs the 512-bit data, applied onto the data lines 40, to the input/output line I/O0 to I/O511 in response to the input/output driver enable signal from the write controller 10.

FIG. 3 is a diagram illustrating a read data line control circuit of a conventional semiconductor memory device having a multi-port.

The control circuit is composed of a read controller 100 enabled by an inverted write control signal Write to receive a column cycle signal Colcyc and output an input/output sense amplifier enable signal; an input/output sense amplifier 140 for receiving 512-bit read data inputted from input/output lines I/O0 to I/O511 to output the read data to the data lines 130 in response to the input/output sense amplifier enable signal from the read controller 100; a first read buffer unit 120 for buffering the 512-bit parallel data inputted from the data lines 130 to output the buffered parallel data to the first port 110 in response to the first port select signal load_P0; a second read buffer unit 122 for buffering the 512-bit parallel data inputted from the data lines 130 to output the buffered parallel data to a second port 112 in response to a second port select signal load_P1; a third read buffer unit 124 for buffering the 512-bit parallel data inputted from the data lines 130 to output the buffered parallel data to a third port 114 in response to a third port select signal load_P2; a fourth read buffer unit 126 for buffering the 512-bit parallel data inputted from the data lines 130 to output the buffered parallel data to a fourth port 116 in response to a fourth port select signal load_P3; and the first to fourth ports 110, 112, 114, and 116 for receiving the 512-bit parallel data from the first to fourth read buffer units 120, 122, 124, and 126, converting the received parallel data to serial data, and output the converted serial data.

FIG. 4 is a read timing diagram of a conventional semiconductor memory device.

The operation for controlling the data lines upon reading data will be described with reference to FIGS. 3 and 4. In order to read the data stored in the memory cell, when receiving an address Addr and a column latch signal Collat as shown in FIG. 4, a column decoder (not shown) generates a column select signal CSL and connects the bit line to the input/output lines I/O0 to I/O511. The read controller 100 is enabled by the write control signal Write inverted as shown in FIG. 4 to receive a column cycle signal Colcyc and output an input/output sense amplifier enable signal to the input/output sense amplifier 140. At this time, the 512-bit data, read from the memory cells, are applied to the I/O sense amplifier 140 via the input/output line I/O1 to I/O511. The input/output sense amplifier 140 is enabled by the input/output sense amplifier enable signal received from the read controller 100 to output the 512-bit parallel data onto the data lines 130. At this time, the first to fourth port select signals load_P0 to load_P3 are sequentially generated in one cycle unit of the column latch signal Collat, as shown in FIG. 4. The first to fourth read buffers 120, 122, 124, and 126 sequentially output 512-bit read data RD as shown in FIG. 4 to the first to fourth ports 110, 112, 114, and 116 in response to the first to fourth select signal load_P0 to load_P3. The first to fourth ports 110, 112, 114, and 116 sequentially output the read data Port0 to Port3 as shown in FIG. 4. Accordingly, the 512-bit data, outputted over an arbitrary column cycle upon the read operation, are adapted to be outputted via any one of the four ports, the first to fourth ports 110, 112, 114, and 116. For this reason, when it is assumed that data outputted during one column cycle is for example 512 bits, the 512-bit data are divided four times and then outputted via the first to fourth ports 110, 112, 114, and 116 since the number of the data outputted via one port is 512-bit data. Accordingly, if a column cycle operation time in the memory is ignored then a multi-port memory with four port units, namely the first to fourth ports 110, 112, 114, and 116 outputs data in four column read operations. A time to output the data at one of the first to fourth ports 110, 112, 114, and 116 is 2 μsec, when a system clock is for, example 100 MHz.

In the conventional memory device having a multi-port as described above, there is a problem that it takes about 2 μsec to output all 512 data bits because memory cell testing equipment is of a low frequency of about 25 MHz, and accordingly, a memory test time becomes several times to several tens of times longer as compared to a memory with 18 DQ, thus deteriorating the throughput.

SUMMARY OF THE INVENTION

The invention, therefore, is conceived to solve the aforementioned problems. It is an objective of the invention to provide a data access circuit of a semiconductor memory device having a multi-port structure in which a time to test memory cells is shortened by reducing a data input/output time, thus improving the throughput.

According to an embodiment of the invention for achieving the aforementioned objective, a data access circuit of a semiconductor memory device has a multi-port, comprising: a write controller enabled by a write control signal Write to receive a column cycle signal Colcyc and to output an input/output driver enable signal; a plurality of ports for each receiving serial data to be written, converting the serial data to a predetermined number of parallel data, and outputting the parallel data; a plurality of read/write data control units for receiving a plurality of port select signals load_P and a port select disable signal Prll_Data_en for selecting a relevant port of the plurality of ports, and outputting port select buffer enable signals and port select buffer disable signals; a plurality of write buffer units for buffering the parallel data received from each of the plurality of ports to simultaneously output the parallel data to data lines in one column latch cycle period in response to the port select buffer enable signals and the port select buffer disable signals from the plurality of read/write data control units; and an input/output driver for receiving data inputted from the data lines to output the received data to a plurality of input/output lines in response to the input/output driver enable signal from the read/write controllers.

According to another embodiment of the invention for achieving the aforementioned objective, a data access circuit of a semiconductor memory device has a multi-port, comprising: a read controller enabled by an inverted write control signal Write to receive a column cycle signal Colcyc and output an input/output sense amplifier enable signal; an input/output sense amplifier to receive read data inputted from a plurality of input/output lines to output the read data to a plurality of data lines in response to the input/output sense amplifier enable signal from the read controller; a plurality of read/write data control units to receive a plurality of port select signals load_P and a port select disable signal Prll_Data_en, and to output port select buffer enable signals and port select buffer disable signals; a plurality of read buffer units to buffer parallel data inputted from the data lines to simultaneously output the buffered parallel data to a plurality of port units in response to the port select buffer enable signals and the port select buffer disable signals from the plurality of read/write data control units; and the plurality of ports to receive the parallel data from the plurality of read buffer units, and to convert the received parallel data to serial data, and outputting the serial data.

According to yet another embodiment of the invention for achieving the aforementioned objective, a data access circuit of a semiconductor memory device has a multi-port, comprising: a write controller enabled by a write control signal Write to receive a column cycle signal Colcyc and to output an input/output driver enable signal; a plurality of ports, for each received serial data to be written, to convert the received serial data to a predetermined number of parallel data, and output the parallel data, and to receive parallel data from a plurality of read buffer units, to convert the received parallel data to serial data, and to output the serial data; a plurality of read/write data control units to receive a plurality of port select signals load_P and a port select disable signal Prll_Data_en to select relevant ports of the plurality of ports, and to output port select buffer enable signals and port select buffer disable signals; a plurality of write buffer units buffer parallel data received from each of the plurality of ports to simultaneously output the parallel data to data lines in one column latch cycle period in response to the port select buffer enable signals and the port select buffer disable signals received from the plurality of read/write data control units; an input/output driver to receive data inputted from the data lines to output the received data to a number of input/output lines in response to the input/output driver enable signal from the read/write controllers; a read controller enabled by an inverted write control signal Write to receive a column cycle signal Colcyc and output an input/output sense amplifier enable signal; an input/output sense amplifier to receive read data inputted from a plurality of input/output lines to output the read data to the plurality of data lines in response to the input/output sense amplifier enable signal from the read controller; and a plurality of read buffer units to buffer the parallel data each inputted from the data lines to simultaneously output the parallel data to the plurality of ports in response to the port select buffer enable signals and the port select buffer disable signals from the plurality of read/write data control units.

The number of the plurality of ports is four, and one of the four ports outputs 512-bit data.

The plurality of read/write controllers output a port select buffer enable signal to select 128-bit data from one of four ports.

The plurality of buffers output 128-bit data received from each of the four ports in response to the port select buffer enable signal from the plurality of read/write controllers.

The plurality of read/write data control units are composed of a plurality of MUX's interconnected by four other MUX's so that only 128 bits of the 512-bit data outputted from each of the respective ports are connected to memory cells, and the plurality of MUX's output one port select enable signal to select the relevant ports from the four ports.

BRIEF DESCRIPTION OF THE DRAWINGS

The above and other features and advantages of the invention will become more apparent to those of ordinary skill in the art by describing in detail preferred embodiments thereof with reference to the attached drawings.

DETAILED DESCRIPTION OF THE INVENTION

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Figure 1:
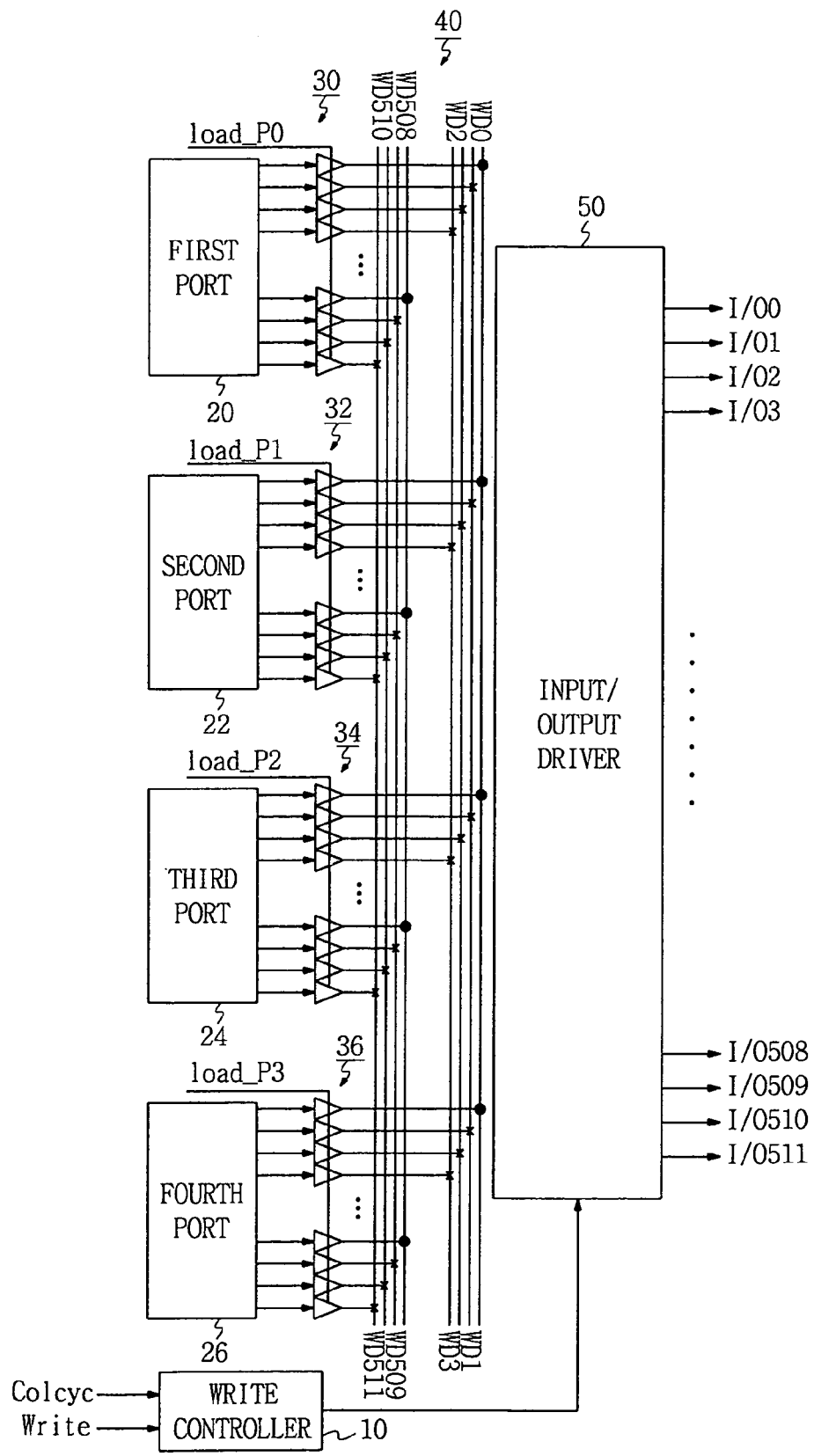
FIG. 1 is a diagram illustrating a write data line control circuit of a conventional semiconductor memory device having a multi-port.
Figure 2:
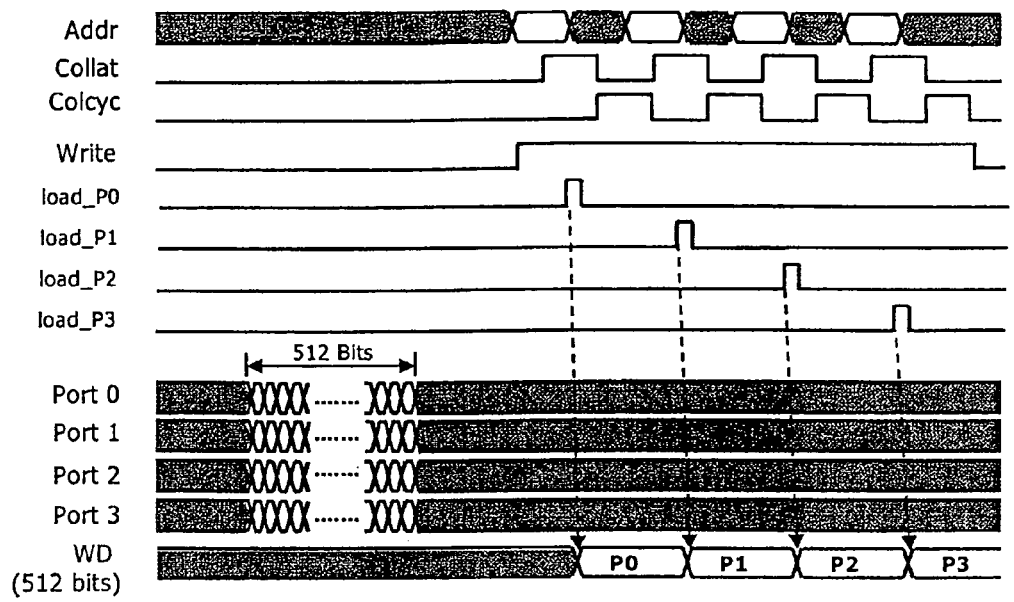
FIG. 2 is a write timing diagram of a conventional semiconductor memory device.
Figure 4:
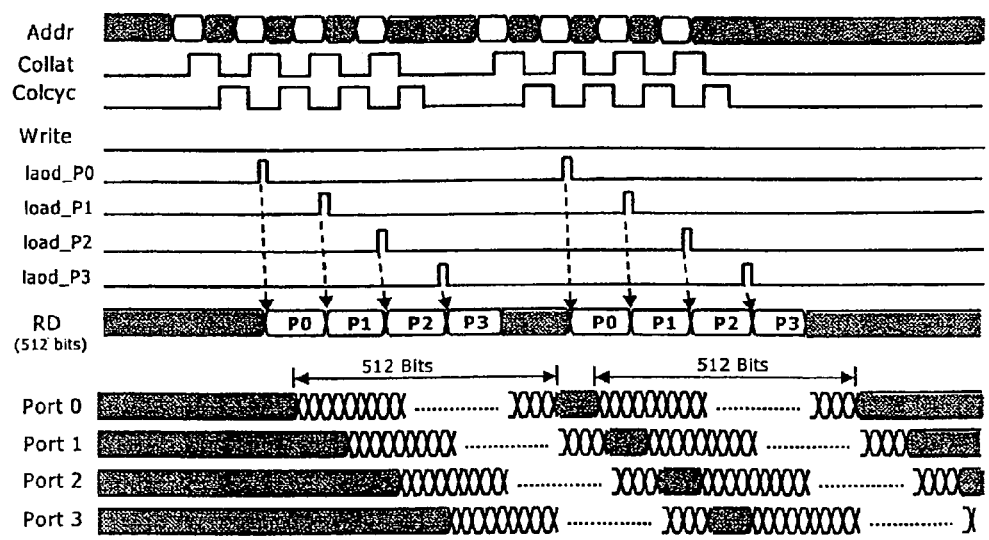
FIG. 4 is a read timing diagram of a conventional semiconductor memory device.
Figure 3:
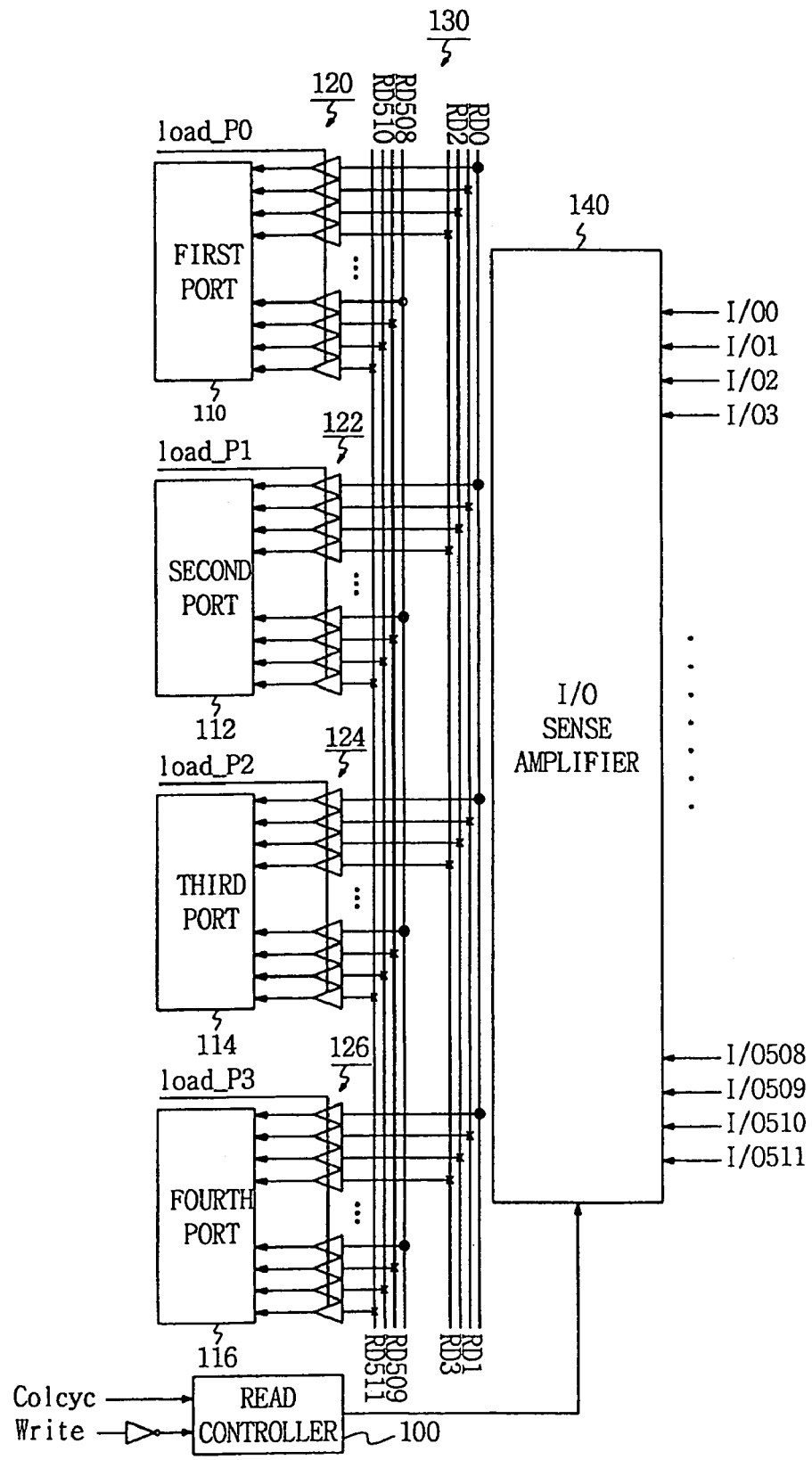
FIG. 3 is a diagram illustrating a read data line control circuit of a conventional semiconductor memory device having a multi-port.
Figure 5:
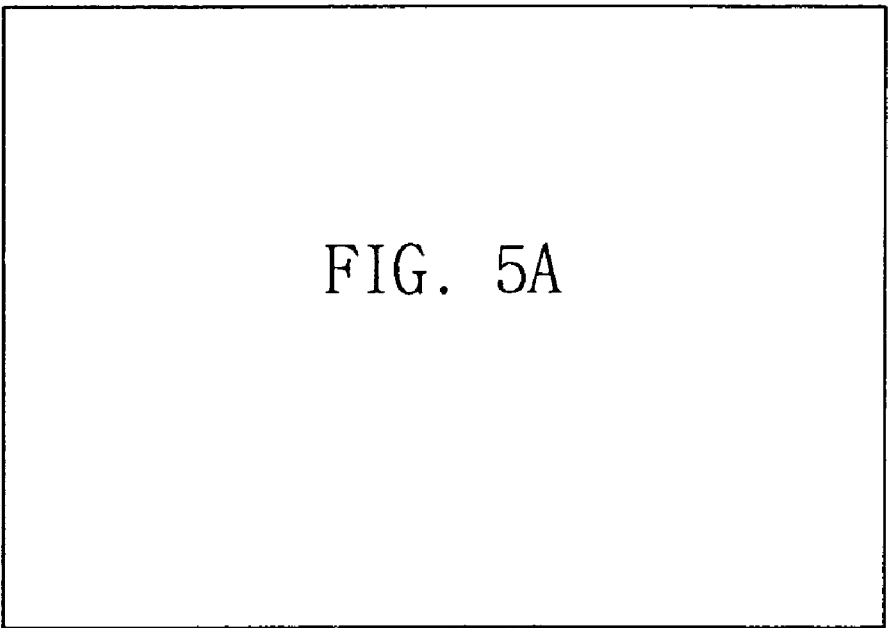
FIG. 5 indicates the relation between the circuits of FIGS. 5A and 5B, where FIGS. 5A and 5B together illustrate a write data line control circuit of a semiconductor memory device having a multi-port according to an embodiment of the invention.
Figure 5:
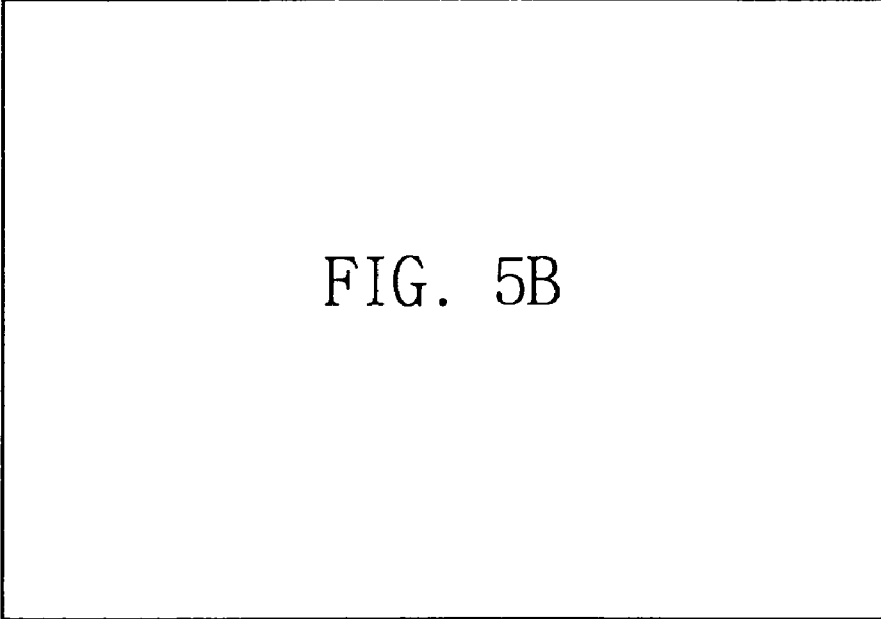
Figure 5A:
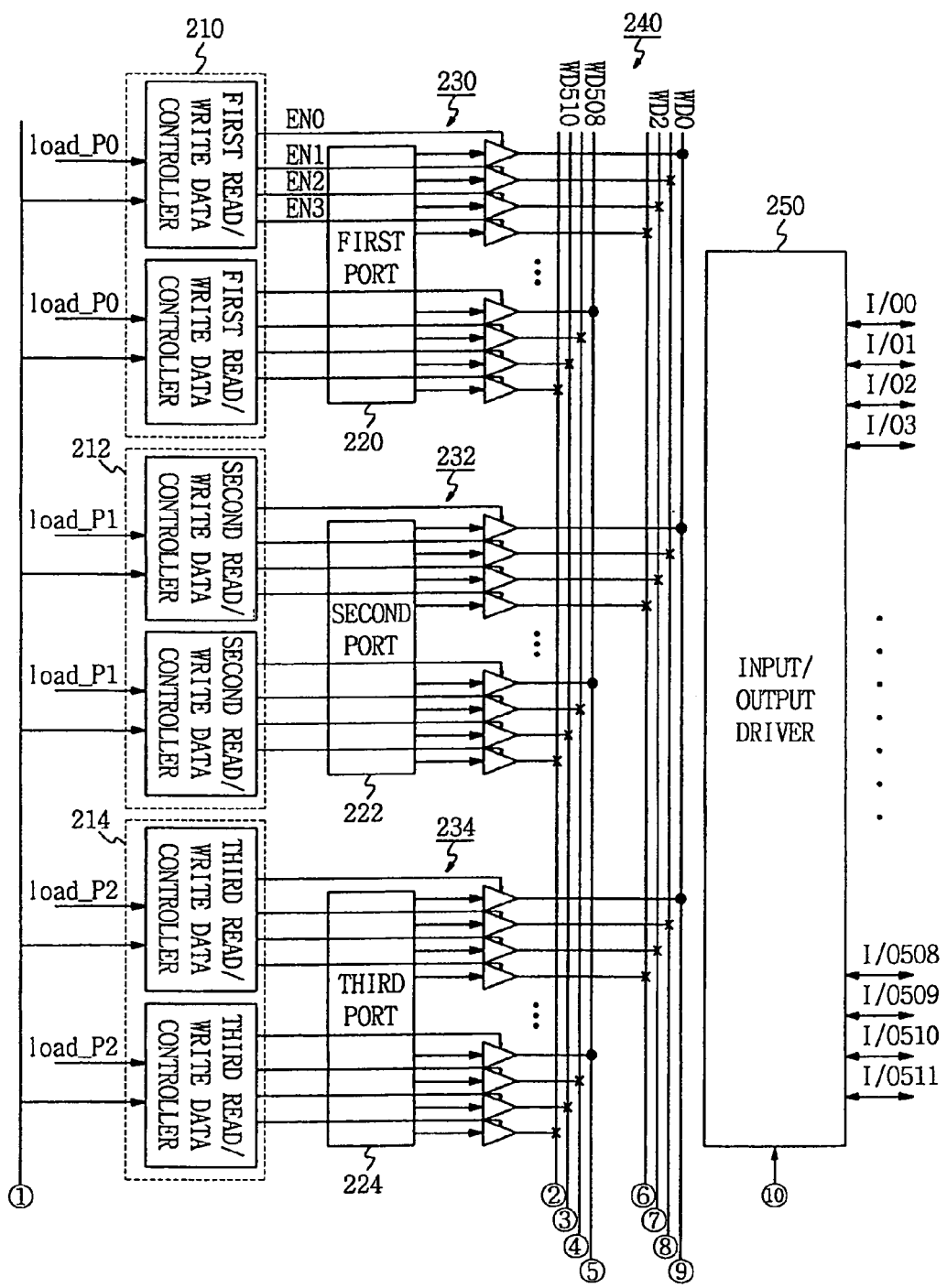
Figure 5B:
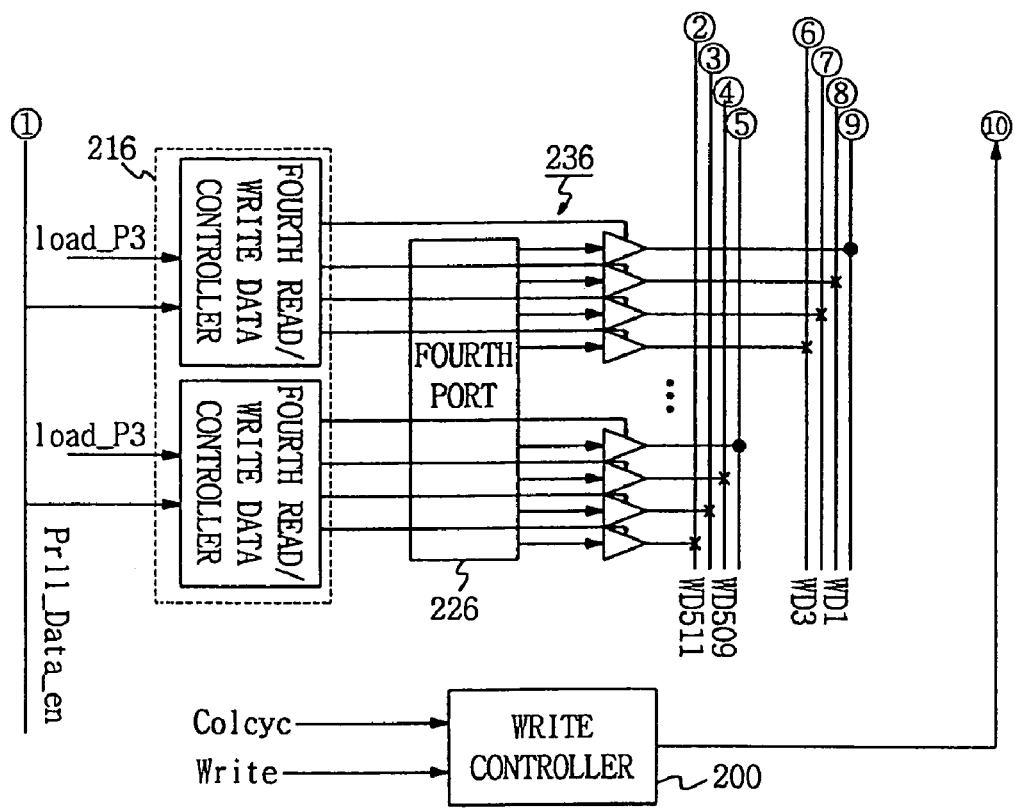

FIG. 5, with FIGS. 5A and 5B, is a diagram illustrating a write data line control circuit of a semiconductor memory device having a multi-port, according to an embodiment of the invention.

The control circuit is composed of a write controller 200 enabled by a write control signal Write to receive a column cycle signal Colcyc and to output an input/output driver enable signal; first to fourth ports 220, 222, 224, and 226 for receiving serial data, converting the serial data to 512-bit parallel data, and outputting the parallel data, respectively. First to fourth read/write data controllers 210, 212, 214, and 216 receive first to fourth port select signals load_P0 to load_P4 and a port select disable signal Prll_Data_en, and output port select buffer enable signals and port select buffer disable signals. A first write buffer unit 230 buffers 128-bit parallel data received from the first port 220 and outputs the buffered data to data lines 240 in response to port select buffer enable signals and the port select buffer disable signals from the first read/write data controller 210. Dots and x's on the data lines 240 represent "switched on" and "switched off" states, respectively. A second write buffer unit 232 buffers 128-bit parallel data received from the second port 222 and outputs the buffered parallel data to the data lines 240 in response to the port select buffer enable signals and the port select buffer disable signals from the second read/write data controller 212. A third write buffer unit 234 buffers 128-bit parallel data received from the third port 224 and outputs the buffered parallel data to the data lines 240 in response to the port select buffer enable signals and the port select buffer disable signals from the third read/write data controller 214. A fourth write buffer unit 236 buffers 128-bit parallel data received from the fourth port 226 and outputs the buffered parallel data to the data lines 240 in response to the port select buffer enable signals and the port select buffer disable signals from the fourth read/write data controller 216. And an input/output driver 250 receives the data inputted from the data lines 240, and outputs the received data to the input/output lines I/O0 to I/O511 in response to the input/output driver enable signal from the write controller 200.

Figure 6:
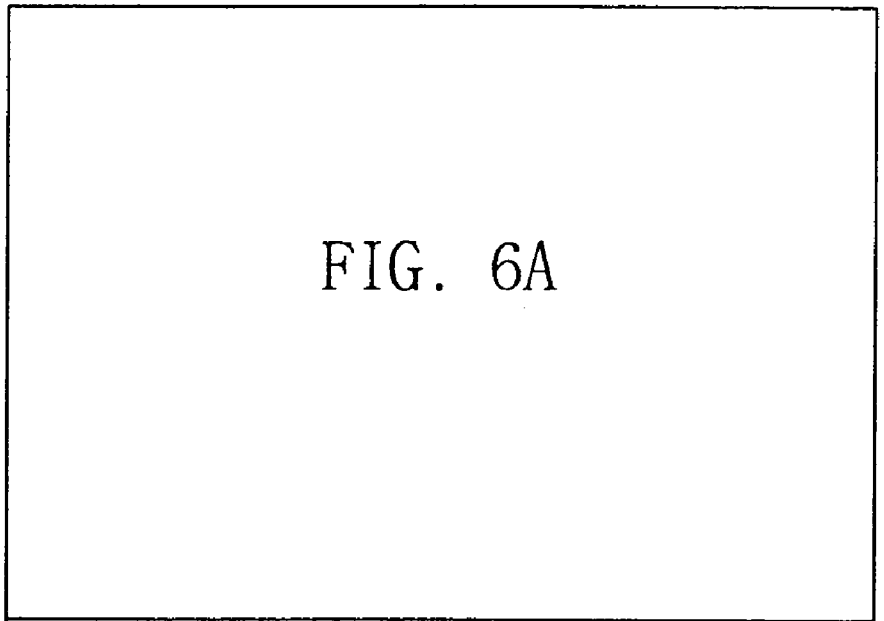
FIG. 6 indicates the relation between the circuits of FIGS. 6A and 6B, where
Figure 6:
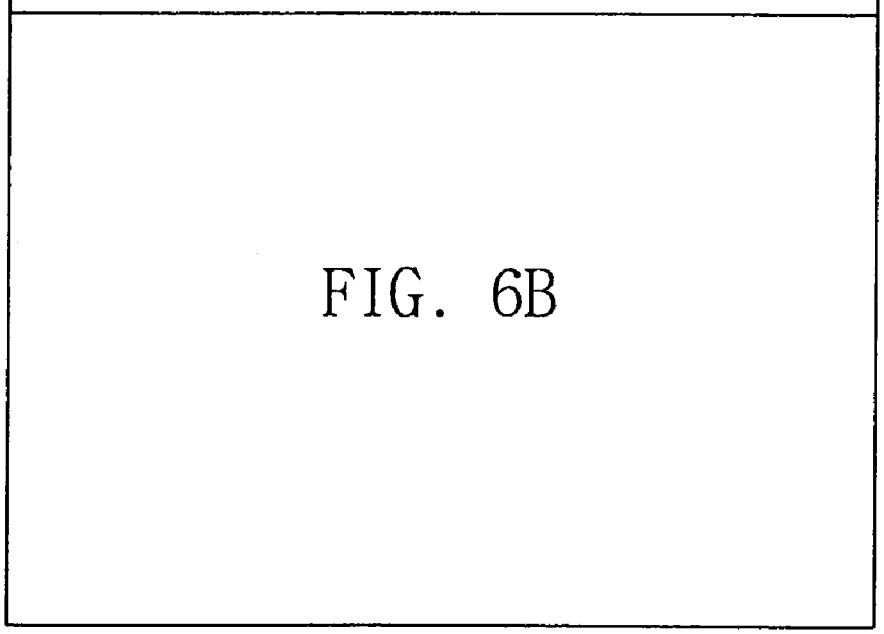
Figure 6A:
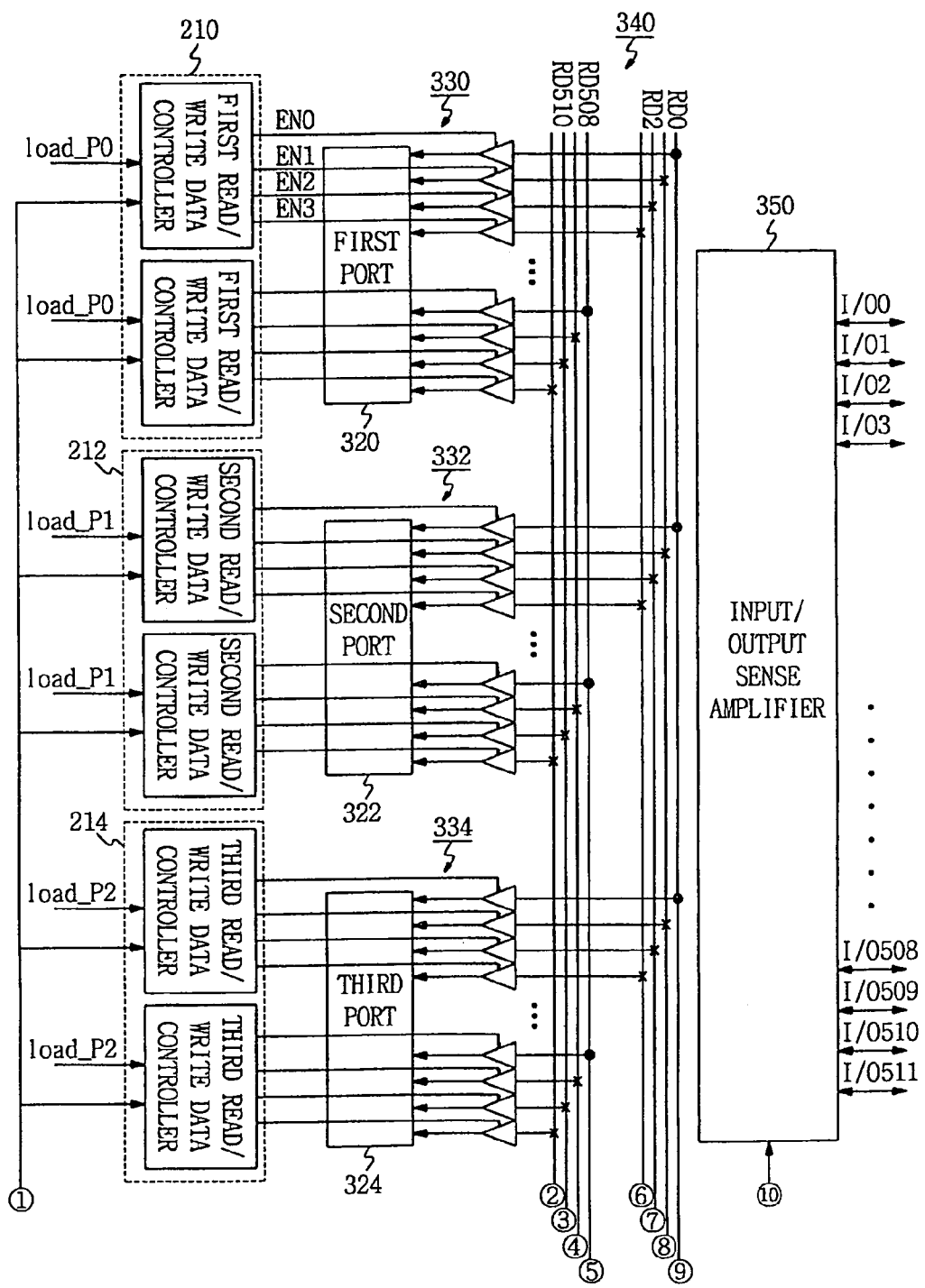
FIGS. 6A and 6B are together illustrate a read data line control circuit of a semiconductor memory device having a multi-port according to an embodiment of the invention.
Figure 6B:
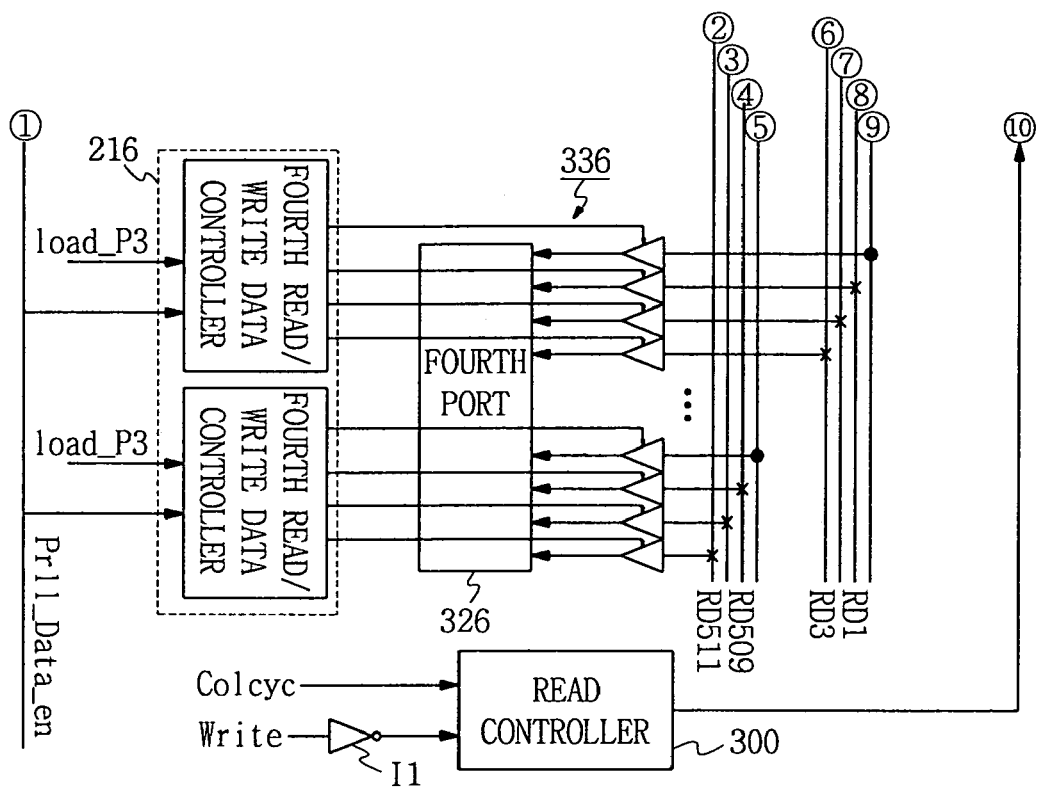

FIG. 6, with FIGS. 6A and 6B, is a diagram illustrating a read data line control circuit of a semiconductor memory device having a multi-port, according to an embodiment of the invention.

The control circuit is composed of a read controller 300 enabled by a write control signal Write inverted by an inverter I1 to receive a column cycle signal Colcyc and output an input/output sense amplifier enable signal. An input/output sense amplifier 350 receives read data inputted from input/output lines I/O0 to I/O511 and outputs the read data to data lines 340 in response to the input/output sense amplifier enable signal from the read controller 300. Dots and x's on the data lines 340 represent "switched on" and "switched off" states, respectively. First to fourth read/write data controllers 210, 212, 214, and 216 receive first to fourth port select signals load_P0 to load_P4 and a port select disable signal Prll_Data_en and output port select buffer enable signals and port select buffer disable signals EN0 to EN3. A first read buffer unit 330 buffers 128-bit parallel data inputted from the data lines 340 and outputting the buffered parallel data to a first port 320 in response to the port select buffer enable signals and the port select buffer disable signals outputted from the first read/write data controller 210. A second read buffer unit 332 buffers 128-bit parallel data inputted from the data lines 340 and outputs the buffered data to a second port 322 in response to the port select buffer enable signals and the port select buffer disable signals from the second read/write data controller 212. A third read buffer unit 334 buffers 128-bit parallel data inputted from the data lines 340 and outputs the buffered data to a third port 324 in response to the port select buffer enable signals and the port select buffer disable signals from the third read/write data controller 214. A fourth read buffer unit 336 buffers 128-bit parallel data inputted from the data lines 340 and outputs the buffered data to a fourth port 326 in response to the port select buffer enable signals and the port select buffer disable signals outputted from the fourth read/write data controller 216. And the first to fourth ports 320, 322, 324, and 326 receive parallel data inputted from the first to fourth read buffers 330, 332, 334, and 336, converting the parallel data to serial data, and output the convert serial data.

Figure 7:
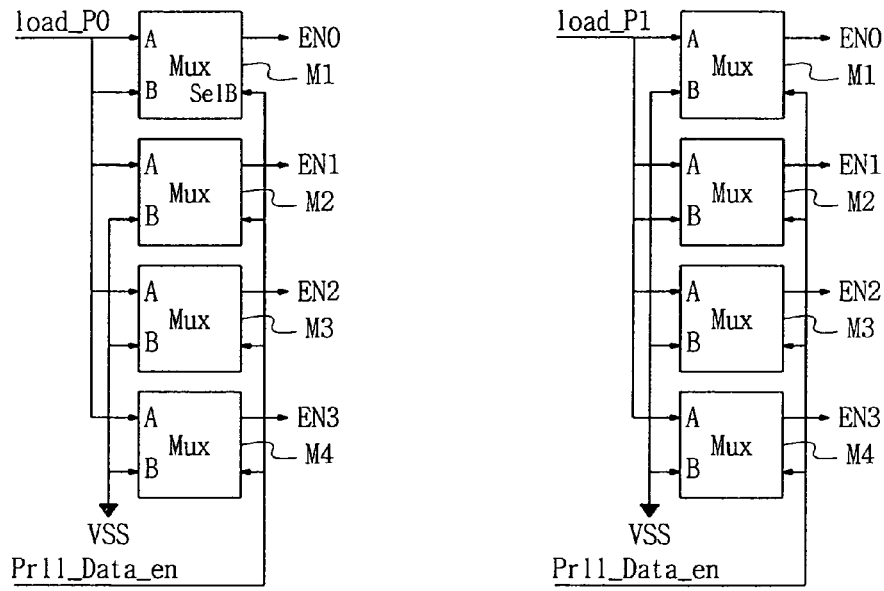
FIG. 7 is a detailed circuit diagram of first to fourth read/write data controllers 210, 212, 214 and 216 according to an embodiment of the invention.
Figure 7:
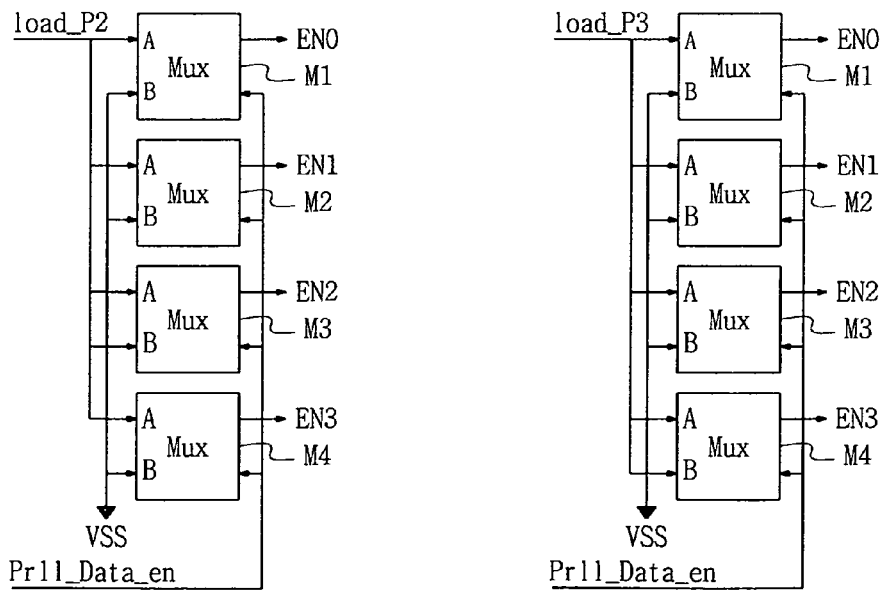

FIG. 7 is a detailed circuit diagram of the first to fourth read/write data controllers 210, 212, 214, and 216 according to the embodiment of the invention.

Each of the first to fourth read/write data controllers 210, 212, 214, and 216 is composed of four MUX's (M1 to M4). In the case where one port is configured to access 128-bit data, each read/write data control unit must comprise 32 sections, each being composed of four MUX's (M1 to M4).

In the first read/write controller 210, a first port select signal load_P0 is connected to input terminals A of the four MUX's (M1 to M4), and to the input terminal B of MUX (M1). A ground voltage signal Vss is connected to input terminals B of MUX's (M2 to M3). Each of the MUX's selects either the first port select signal load_P0 or the ground voltage signal Vss according to a port select disable signal Prll_Data_en, and outputs, accordingly, port select buffer enable signals or port select buffer disable signals.

In the second read/write controller 212, a second port select signal load_P1 is connected to input terminals A of four MUX's (M1 to M4), and to the input terminal B of MUX (M2). A ground voltage signal Vss is connected to input terminals B of MUX's (M1, M3, and M4). Each of the MUX's selects either the first port select signal load_P1 or the ground voltage signal Vss according to a port select disable signal Prll_Data_en, and outputs, accordingly, port select buffer enable signals or port select buffer disable signals.

In the third read/write controller 214, a third port select signal load_P2 is connected to input terminals A of four MUX's (M1 to M4), and to the input terminal B of MUX (M3). A ground voltage signal Vss is connected to input terminals B of MUX's (M1 to M3). Each of the MUX's selects either the first port select signal load_P2 or the ground voltage signal Vss according to a port select disable signal Prll_Data_en, and outputs, accordingly, port select buffer enable signals or port select buffer disable signals.

In the fourth read/write controller 216, a fourth port select signal load_P3 is connected to input terminals A of 4 MUX's (M1 to M4), and to the input terminal B of MUX (M4). A ground voltage signal Vss is connected to input terminals B of MUX's (M1 to M3). Each of the MUX's selects either the first port select signal load_P3 or the ground voltage signal Vss according to a port select disable signal Prll_Data_en, and outputs, accordingly, port select buffer enable signals or port select buffer disable signals.

Figure 8:
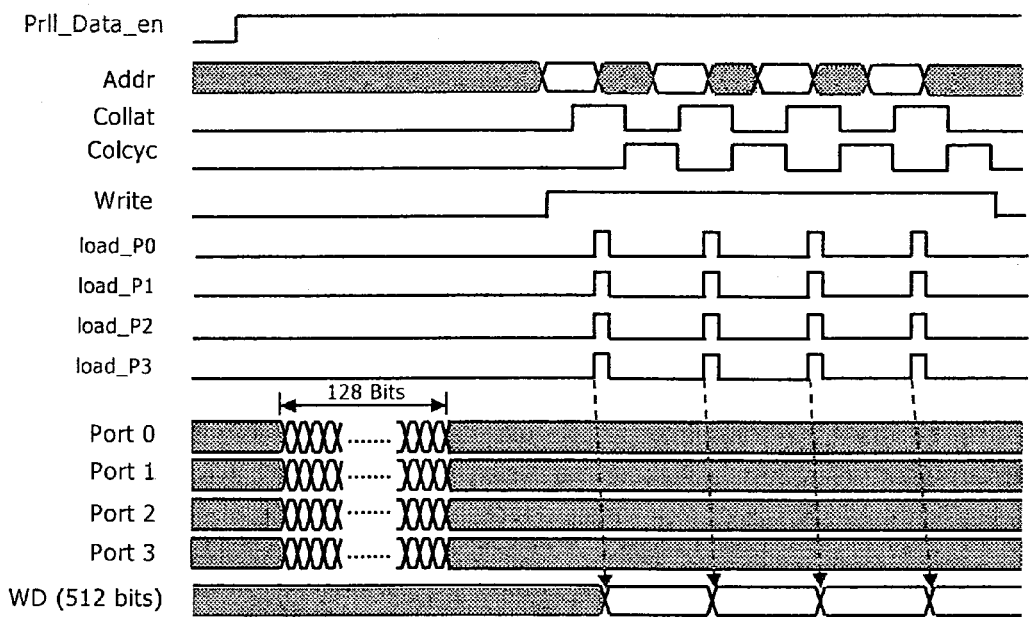
FIG. 8 is a write timing diagram of a semiconductor memory device according to an embodiment of the invention.

FIG. 8 is a write timing diagram of a semiconductor memory device according to an embodiment of the invention.

Figure 9:
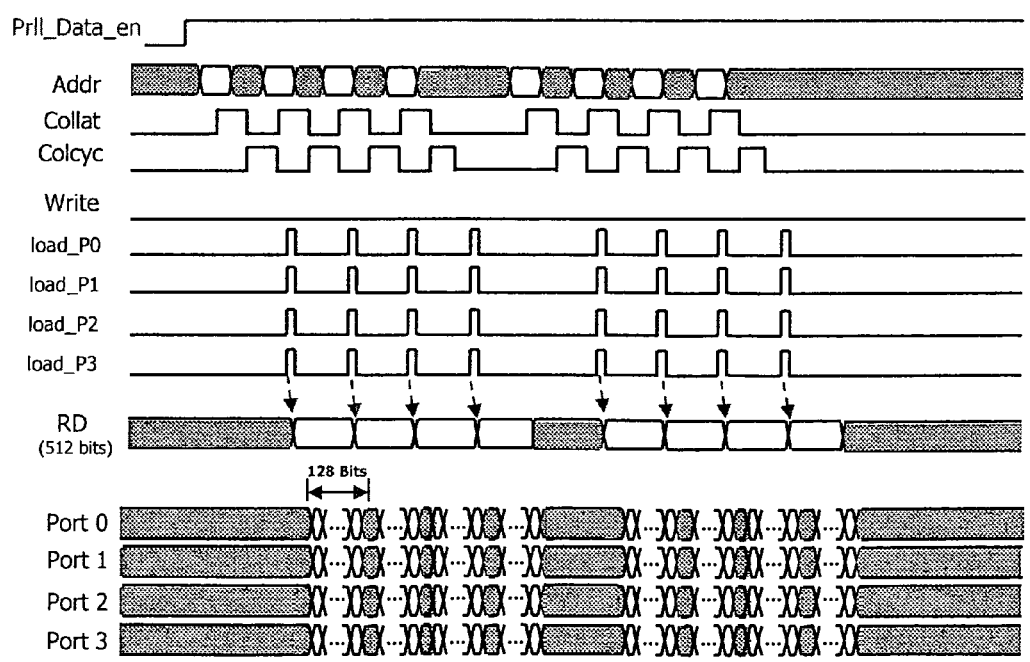
FIG. 9 is a read timing diagram of a semiconductor memory device according to an embodiment of the invention.

FIG. 9 is a read timing diagram of a semiconductor memory device according to an embodiment of the invention.

The operation of accessing the data lines according to a preferred embodiment of the invention will be described in detail with reference to FIGS. 5 to 9.

The operation of controlling the data lines upon writing data will be first described. In order to write data to memory cells, when receiving an address Addr and a column latch signal Collat (Collat) as shown in FIG. 8, a column decoder (not shown) generates a column select signal CSL to connect bit lines with the input/output lines IO0 to IO511. The write controller 200 is enabled by a write control signal Write as shown in FIG. 8, to receive a column cycle signal Colcyc, and to consequently output an input/output drive enable signal to the input/output driver 250. At this time, serial data to be written is applied to the first to fourth ports 220, 222, 224, and 226. The first to fourth ports 220, 222, 224, and 226 receive the serial data, converts the received serial data to 512-bit parallel data (herein named PORT0 for the first 128 data bits, and so on to PORT3), as shown in FIG. 8, and outputting the parallel data to the first to fourth write buffer units 230, 232, 234, and 236. At this time, the first to fourth port select signals load_P0 to load_P3 are generated every cycle of the column latch signal Collat, as shown in FIG. 8. The first to fourth write buffer units 230, 232, 234, and 236 simultaneously output a total of 512-bit write data WD in parallel, in response to the first to fourth port select signals load_P0 to load_P3, as shown in FIG. 8.

The operation of the first to fourth read/write data controllers 210, 212, 214, and 216 will be described in detail with reference to FIG. 7.

The first port select signal load_P0, as shown in FIG. 8, is applied to the input terminals A of the MUX's (M1 to M4) and to the input terminal B of the MUX (M1), and a ground voltage signal Vss is applied to the input terminals B of the MUX's (M2 to M4). At this time, if the port select disable signal Prll_Data_en, which is a select signal, is transitioned to a high state as in FIG. 8, the MUX (M1) selects the first port select signal load_P0, inputted via the input terminal B, and outputs the port select buffer enable signal, and the MUX's (M2 to M4) select the ground voltage signal Vss, inputted via the input terminal B, to output the port select buffer disable signal.

The second port select signal load_P1, as shown in FIG. 8, is applied to the input terminals A of the MUX's (M1 to M4) and the input terminal B of the MUX (M2), and the ground voltage signal Vss is applied to the input terminals B of the MUX's (M1, M3, and M4). At this time, if the port select disable signal Prll_Data_en, which is a select signal, is transitioned to a high state as shown in FIG. 8, the MUX (M2) selects the second port select signal load_P1, inputted via the input terminal B, and outputs the port select buffer enable signal, and the MUX's (M1, M3 and M4) select the ground voltage signal Vss, inputted via the input terminal B, and output the port select buffer disable signal.

The third port select signal load_P2, as shown in FIG. 8, is applied to the input terminals A of the MUX's (M1 to M4) and to the input terminal B of the MUX (M3), and the ground voltage signal Vss is applied to the input terminals B of the MUX's (M1, M2 and M4). At this time, if the port select disable signal Prll_Data_en, which is a select signal, is transitioned to a high state, as shown in FIG. 8, the MUX (M2) selects the third port select signal load_P2, inputted via the input terminal B, and outputs the port select buffer enable signal, and the MUX's (M1, M2 and M4) select the ground voltage signal Vss, inputted via the input terminal B, and output the port select buffer disable signal.

The fourth port select signal load_P3, as shown in FIG. 8, is applied to the input terminals A of the MUX's (M1 to M4) and to the input terminal B of the MUX (M4), and the ground voltage signal, Vss is applied to the input terminals B of the MUX's (M1 to M3). At this time, if the port select disable signal Prll_Data_en, which is a select signal, is transitioned to a high state as shown in FIG. 8, the MUX (M4) selects the fourth port select signal load_P3, inputted via the input terminal B, and outputs the port select buffer enable signal, and the MUX's (M1 to M3) select the ground voltage signal Vss, inputted via the input terminal B, and output the port select buffer disable signal.

By doing so, the first write buffer unit 230 receives 512-bit data from the first port 220, buffers 128-bit data Port0, as shown in FIG. 8, enabled by the first port select signal load_P0, and then outputs the buffered data to the data lines 240. The second write buffer unit 232 receives 512-bit data from the second port 222, buffers 128-bit bit dataPort1, as shown in FIG. 8, enabled by the second port select signal load_P1, and then outputs the buffered data to the data lines 240. The third write buffer unit 234 receives 512-bit data from the third port 224, buffers 128-bit dataPort2, as shown in FIG. 8, enabled by the third port select signal load_P2, and then outputs the buffered data to the data lines 240. The fourth write buffer unit 236 receives 512-bit data from the fourth port 226, buffers 128-bit data Port3 as shown in FIG. 8, enabled by the fourth port select signal load P3, and outputs the buffered data to the data lines 240. Accordingly, each of the first to fourth write buffer units 230, 232, 234, and 236 buffers 128-bit data, and simultaneously outputs a total of 512-bit data WD as shown in FIG. 8, to the data lines 240.

The data, outputted onto the data lines 240, is applied to the input/output driver 250. The input/output driver 250 outputs the data, to the input/output lines I/O0 to I/O511 in response to the input/output driver enable signal from the write controller 200.

The operation for controlling the data lines upon reading the data will be described with reference to FIGS. 6, 7 and 9. In order to read the data stored in the memory cells, when receiving an address Addr and a column latch signal Collat as shown in FIG. 9, a column decoder (not shown) generates a column select signal CSL to connect the bit line with the input/output lines I/O0 to I/O511. The read controller 300 is enabled by the write control signal Write inverted by the inverter I1, as shown in FIG. 9, to receive the column cycle signal Colcyc, of FIG. 9 and to consequentially output the input/output sense amplifier enable signal to the input/output sense amplifier 350. At this time, the data read from the memory cell is applied to the I/O sense amplifier 350 via the input/output lines I/O0 to I/O511. The input/output sense amplifier 350 is enabled by the input/output sense amplifier enable signal received from the read controller 300 to output the read parallel data to the data lines 340. At this time, the first to fourth port select signals load_P0 to load_P3 are simultaneously generated every cycle of the column latch signal Collat, as shown in FIG. 9. The first to fourth read buffer units 330, 332, 334, and 336 simultaneously output the read data to the first to fourth ports 320, 322, 324, and 326 in response to the first to fourth port select signals load_P0 to load_P3, as shown in FIG. 9. The first to fourth ports 320, 322, 324, and 326 simultaneously output the read data Port0 to Port3 in parallel, as shown in FIG. 9.

The read operation of the first to fourth read/write data control portions 210, 212, 214, and 216 will be described in detail with reference to FIG. 7.

The first port select signal load_P0, as shown in FIG. 9, is applied to the input terminals A of MUX's (M1 to M4) and to the input terminal B of MUX (M1), and the ground voltage signal Vss is applied to the input terminals B of MUX's (M2 to M4). At this time, if the port select disable signal Prll_Data_en, which is a select signal, is transitioned to a high state, as in FIG. 9, the MUX (M1) selects the first port select signal load_P0, inputted via the input terminal B, and outputs the port select buffer enable signal, and the MUX's (M2 to M4) select the ground voltage signal Vss, inputted via the input terminal B, and output the port select buffer disable signal.

The second port select signal load_P1, as shown in FIG. 9, is applied to the input terminals A of MUX's (M1 to M4) and to the input terminal B of MUX (M2), and the ground voltage signal Vss is applied to the input terminals B of MUX's (M1, M3, and M4). At this time, if the port select disable signal Prll_Data_en, which is a select signal, is transitioned to a high state, as in FIG. 9, the MUX (M2)

selects the second port select signal load_P1, inputted via the input terminal B, and outputs the port select buffer enable signal, and the MUX's (M1, M3 and M4) select the ground voltage signal Vss, inputted via the input terminal B, and output the port select buffer disable signal.

The third port select signal load_P2, as in FIG. 9 is applied to the input terminals A of MUX's (M1 to M4) and to the input terminal B of MUX (M3), and the ground voltage signal Vss is applied to the input terminals B of MUX's (M1, M2, and M4). At this time, if the port select disable signal Prll_Data_en, which is a select signal, is transitioned to a high state, as in FIG. 9, the MUX (M2) selects the third port select signal load_P2, inputted via the input terminal B, and outputs the port select buffer enable signal, and the MUX's (M1, M2, and M4) select the ground voltage signal Vss, inputted via the input terminal B, and output the port select buffer disable signal.

The fourth port select signal load_P3, as in FIG. 9, is applied to the input terminals A of MUX's (M1 to M4) and to the input terminal B of MUX (M4), and the ground voltage signal Vss is applied to the input terminals B of MUX's (M1 to M3). At this time, if the port select disable signal Prll_Data_en, which is a select signal, is transitioned to a high state, as in FIG. 9, the MUX (M4) selects the fourth port select signal load_P3, inputted via the input terminal B, and outputs the port select buffer enable signal, and the MUX's (M1 to M3) select the ground voltage signal Vss, inputted via the input terminal B, and output the port select buffer disable signal.

By doing so, the first read buffer unit 330 receives 512-bit data from the data lines 340, buffers 128-bit data Port0, as shown in FIG. 9, enabled by the first port select signal load_P0, and then outputs the buffered data to the first port 320. The second read buffer unit 332 receives 512-bit data from the data lines 340, buffers 128-bit dataPort1, as shown in FIG. 9, enabled by the second port select signal load_P1 and then outputs the buffered data to the second port 322. The third read buffer unit 334 receives 512-bit data from the data lines 340, buffers 128-bit data Port2, as shown in FIG. 9, enabled by the third port select signal load_P2 and then outputs the buffered data to the third port 324. The fourth read buffer unit 336 receives 512-bit data from the data lines 340, buffers 128-bit data Port3 as shown in FIG. 9, enabled by the fourth port select signal load_P3 and outputs the buffered data to the fourth port 326.

Accordingly, each of the first to fourth read buffer units 330, 332, 334, and 326 buffer the 128-bit data, and simultaneously output a total of 512-bit data WD as shown in FIG. 9 to the first to fourth ports 320, 322, 324, and 326.

Thus, the data that is outputted over an arbitrary column cycle upon the read operation is adapted so that a total of 512-bit data is simultaneously outputted via the four port unit, namely, the first to fourth ports 320, 322, 324, and 326 each by 128-bits data.

Accordingly, since the data memory with the four port units 320, 322, 324, and 326 output a total of 512-bit data by 128 bits in one column read operation, a time to output the data becomes 0.5 μsec when a system clock is, for example 100 MHz.

Although the invention has been described by way of example in connection with an embodiment where the data that is outputted via one port at a time has a size of 128 bits, a multi-channel memory, which has data lines for respective n-bit read/write data and m ports, must comprise MUX's at respective ports, the number of which corresponds to n/m in which data are divided by n/m.

As described above, the invention has an advantage that in the semiconductor memory device having a multi-port, a test time can be shortened by doubling the number of ports even in low frequency equipment, thus improving the throughput, by allowing data to be simultaneously and divisionally accessed via all ports, instead of accessing the data via a specified port at a time.

What is claimed is:

1. A data access circuit of a semiconductor memory device, comprising:
    a read/write controller enabled by a write control signal to receive a column cycle signal and to output an input/output driver enable signal;
    a plurality of ports each to receive serial data to be written, to convert the serial data to parallel data divided into a first portion and a second portion, and to output the parallel data;
    a plurality of read/write data control units to receive a plurality of port select signals and a port select disable signal to select a relevant port of the plurality of ports, and to output port select buffer enable signals and port select buffer disable signals;
    a plurality of write buffer units to buffer the parallel data received from each of the plurality of ports to simultaneously output only one of the first portion and the second portion of the parallel data of each of the plurality of ports to data lines in one column latch cycle period in response to the port select buffer enable signals and the port select buffer disable signals from the plurality of read/write data control units; and
    an input/output driver to receive data inputted from the data lines to output the received data to a plurality of input/output lines in response to the input/output driver enable signal from the read/write controller.

2. The circuit according to claim 1, where the number of the plurality of ports is four.

3. The circuit according to claim 2, where one of the four ports outputs 512-bit data.

4. The circuit according to claim 3, where the plurality of read/write data control units output a port select buffer enable signal for selecting 128-bit data from one of the four ports.

5. The circuit according to claim 4, where the plurality of write buffer units output 128-bit data received from each of the four ports in response to the port select buffer enable signal from the plurality of read/write controllers.

6. The circuit according to claim 5, where the plurality of read/write data control units are composed of a plurality of MUX's that are interconnected in groups of four so that only 128 bits of the 512-bit data from each port are connected to memory cells, and each group of four MUX's output one port select enable signal to select a relevant port.

7. The circuit according to claim 1, wherein the plurality of read/write data control units include a plurality of MUX's that are interconnected in groups so that in a first operation only one of the first portion and the second portion of the parallel data from each port is output to the data lines, and in a second operation the other portion is output to the data lines.

8. The circuit according to claim 7, wherein each group of the MUX's output one port select enable signal to select a port.

9. The circuit according to claim 1, wherein each of the plurality of read/write data control units in configured to output one buffer enable signal per every one of the plurality of write buffer units.

10. A data access circuit of a semiconductor memory device, comprising:
- a read/write controller enabled by an inverted write control signal to receive a column cycle signal and to output an input/output sense amplifier enable signal;
- an input/output sense amplifier to receive read data inputted from a plurality of input/output lines to output the read data to a plurality of data lines in response to the input/output sense amplifier enable signal from the read controller;
- a plurality of read/write data control units to receive a plurality of port select signals and a port select disable signal and to output port select buffer enable signals and port select buffer disable signals;
- a plurality of first and second read buffer units corresponding to a plurality of ports to buffer parallel data inputted from the data lines to simultaneously output the buffered parallel data of only one of the first and second read buffer units for each of the plurality of ports in response to the port select buffer enable signals and the port select buffer disable signals from the plurality of read/write data control units; and
- the plurality of ports to receive the parallel data from the plurality of read buffer units, and to convert the received parallel data to serial data, and outputting the serial data.

11. The circuit according to claim 10, where the number of the plurality of ports is four.

12. The circuit according to claim 11, where one of the four ports outputs 512-bit data.

13. The circuit according to claim 12, where the plurality of read/write data control units output a port select buffer enable signal for selecting 128-bit data from the one of the four ports.

14. The circuit according to claim 13, where the plurality of read buffer units output 128-bit data outputted from each of the four ports in response to the port select buffer enable signal from the plurality of read/write controllers.

15. The circuit according to claim 14, where the plurality of read/write data control units are composed of a plurality of MUX's interconnected in groups of four so that only 128 bits of the 512-bit data outputted from each of the respective ports are connected to memory cells, and each group of four MUX's output one port select enable signal to select a relevant port.

16. The circuit according to claim 10, wherein the plurality of read/write data control units are composed of a plurality of MUX's interconnected in groups so that only the data of one of the first and second read buffer units is outputted to each of the respective ports, and each group of the MUX's output one port select enable signal to select a port.

17. A data access circuit of a semiconductor memory device, comprising:
- a read/write controller enabled by a write control signal to receive a column cycle signal and to output an input/output driver enable signal;
- a plurality of ports each to receive serial data to be written, to convert the received serial data to a predetermined number of parallel data, to output the parallel data, and to receive parallel data from a plurality of read buffer units, converting the received parallel data to serial data, and outputting the serial data;
- a plurality of read/write data control units to receive a plurality of port select signals and a port select disable signal to select relevant ports of the plurality of ports, and to output port select buffer enable signals and port select buffer disable signals;
- a plurality of write buffer units to buffer the parallel data received from each of the plurality of ports to simultaneously output only a portion of the parallel data to data lines in one column latch cycle period in response to the port select buffer enable signals and the port select buffer disable signals received from the plurality of read/write data control units;
- an input/output driver to receive data inputted from the data lines to output the received data to a number of input/output lines in response to the input/output driver enable signal from the read/write controller;
- a read/write controller enabled by an inverted write control signal to receive a column cycle signal and to output an input/output sense amplifier enable signal;
- an input/output sense amplifier to receive read data inputted from a plurality of input/output lines to output the read data to the plurality of data lines in response to the input/output sense amplifier enable signal from the read controller; and
- a plurality of first and second read buffer units to buffer the parallel data each inputted from the data lines to simultaneously output only the parallel data of one of the first and second read buffer units to each of the plurality of ports in response to the port select buffer enable signals and the port select buffer disable signals from the plurality of read/write data control units.

18. The circuit according to claim 17, where the number of the plurality of ports is four.

19. The circuit according to claim 18, where one of the four ports outputs 512-bit data.

20. The circuit according to claim 19, where the plurality of read/write data control units output a port select buffer enable signal for selecting 128-bit data from one of four ports.

21. The circuit according to claim 20, where the plurality of write buffer units and read buffer units output 128-bit data received and outputted, respectively, from each of the four ports in response to the port select buffer enable signal from the plurality of read/write controllers.

22. The circuit according to claim 21, where the plurality of read/write data control units are composed of a plurality of MUX's interconnected in groups of four so that only 128 bits of the 512-bit data outputted from each of the respective ports are connected to memory cells, and each group of four MUX's output one port select enable signal to select a relevant port.

23. The circuit according to claim 17, wherein the plurality of read/write data control units are composed of a plurality of MUX's interconnected in groups so that only a portion of the data outputted from each of the respective ports are outputted to the data lines.

* * * * *

UNITED STATES PATENT AND TRADEMARK OFFICE
CERTIFICATE OF CORRECTION

PATENT NO. : 7,280,427 B2 Page 1 of 1
APPLICATION NO. : 11/015462
DATED : October 9, 2007
INVENTOR(S) : Dong-Hak Shin It is certified that error appears in the above-identified patent and that said Letters Patent is hereby corrected as shown below:

Column 2, line 65, the words "IQ0 to IQ511" should read -- IO0 to IO511 --;
Column 10, line 9, the words "load P3" should read -- load_P3 --;
Column 11, line 36, the word "load_P1" should read -- load_P1, --;
Column 11, line 40, the word "load_P2" should read -- load_P2, --;
Column 11, line 44, the word "load_P3" should read -- load_P3, --.

Signed and Sealed this

Twenty-third Day of September, 2008

JON W. DUDAS
*Director of the United States Patent and Trademark Office*